United States Patent
Chuang et al.

(10) Patent No.: US 12,416,860 B2
(45) Date of Patent: Sep. 16, 2025

(54) PHOTORESIST FILM AND APPLICATION THEREOF

(71) Applicant: CHANG CHUN PLASTICS CO., LTD., Taipei (TW)

(72) Inventors: Zih-I Chuang, Taipei (TW); Yun-Jung Wu, Taipei (TW); E-Ming Ho, Taipei (TW)

(73) Assignee: Chang Chun Plastics Co., Ltd., Taipei (TW)

( * ) Notice: Subject to any disclaimer, the term of this patent is extended or adjusted under 35 U.S.C. 154(b) by 0 days.

(21) Appl. No.: 18/366,468

(22) Filed: Aug. 7, 2023

(65) Prior Publication Data

US 2024/0069440 A1    Feb. 29, 2024

Related U.S. Application Data

(60) Provisional application No. 63/374,044, filed on Aug. 31, 2022.

(30) Foreign Application Priority Data

May 23, 2023  (TW) .................................. 112119118

(51) Int. Cl.
*G03F 7/038* (2006.01)
*G03F 7/11* (2006.01)

(52) U.S. Cl.
CPC ................ *G03F 7/038* (2013.01); *G03F 7/11* (2013.01)

(58) Field of Classification Search
CPC ............. G03F 7/038; G03F 7/11; G03F 7/027
See application file for complete search history.

(56) References Cited

U.S. PATENT DOCUMENTS

| | | | | |
|---|---|---|---|---|
| 2010/0216070 A1* | 8/2010 | Yamanaka | ............... | C08L 79/08 |
| | | | | 528/322 |
| 2015/0014029 A1 | 1/2015 | Iwayama et al. | | |
| 2019/0294045 A1* | 9/2019 | Ichioka | ................... | G03F 7/038 |
| 2022/0011669 A1* | 1/2022 | Yorisue | ................... | G03F 7/037 |
| 2023/0375930 A1* | 11/2023 | Kunimatsu | ............. | B32B 27/30 |

FOREIGN PATENT DOCUMENTS

| | | | | |
|---|---|---|---|---|
| CN | 103460132 A | 12/2013 | | |
| TW | 202136325 A | 10/2021 | | |
| WO | WO-2021137466 A1 * | 7/2021 | ................ | C08F 2/50 |
| WO | WO 2022/085366 A1 | 4/2022 | | |

OTHER PUBLICATIONS

English Machine Translation of WO 2021137466 A1 (Year: 2021).*
https://www.chemnet.com/cas/en/6143-80-2/1H-Imidazole,2-(2-chlorophenyl)-4,5-diphenyl-,-dimer.html (Year: 2025).*

* cited by examiner

*Primary Examiner* — Jonathan Johnson
*Assistant Examiner* — Alexander N. Lee
(74) *Attorney, Agent, or Firm* — Christensen, Fonder, Dardi & Herbert PLLC; John P. Fonder

(57) ABSTRACT

A photoresist film and application thereof are provided. The photoresist film has a thickness T with a unit of μm, and when the photoresist film is characterized by ultraviolet-visible spectroscopy, the photoresist film has an absorbance $A_{405\,nm}$ at 405 nm and an absorbance $A_{436\,nm}$ at 436 nm, wherein $0 < A_{405\,nm}/T \leq 0.006$ and $0 < A_{436\,nm}/T \leq 0.005$, and the thickness T is 60 μm to 600 μm.

8 Claims, No Drawings

PHOTORESIST FILM AND APPLICATION THEREOF

CLAIM FOR PRIORITY

This application claims the benefits of U.S. Provisional Patent Application No. 63/374,044 filed on Aug. 31, 2022, and Taiwan Patent Application No. 112119118 filed on May 23, 2023, the subject matters of which are incorporated herein in their entirety by reference.

BACKGROUND OF THE INVENTION

Field of the Invention

The present application provides a photoresist film, in particular a high-thickness photoresist film, and applications thereof.

Descriptions of the Related Art

Photoresist films can be divided into positive photoresist films and negative photoresist films depending on the change of photoresist film after exposure and development. A positive photoresist film is a type of photoresist in which the portion of the photoresist film that is exposed to light becomes soluble in the photoresist developer, and the portion of the photoresist film that is not exposed to light remains after development. A negative photoresist film is a type of photoresist in which the portion of the photoresist film that is not exposed to light is soluble in the photoresist developer, and the portion of the photoresist film that is exposed to light remains after development.

In the printed circuit boards (PCBs) industry, photoresist films are used in the etching procedure or electroplating procedure in order to form circuit patterns. Due to electronic components' increasing complexity and size, a thick photoresist film with a high depth-to-width ratio is required in the printed circuit board industry. However, the conventional photoresist film cannot stably form high-precision photoresist patterns after exposure and development and has poor photoresist profile or obvious footings, which result in poor accuracy of etching or electroplating. Therefore, an improvement in photoresist film is needed.

SUMMARY OF THE INVENTION

Given the above technical problems, the present application provides a photoresist film with an excellent photoresist profile after light exposure and can realize high-accuracy etching or electroplating processing.

Therefore, an objective of the present application is to provide a photoresist film, which has a thickness T with a unit of µm, and when the photoresist film is characterized by ultraviolet-visible spectroscopy, the photoresist film has an absorbance $A_{405\ nm}$ at 405 nm and an absorbance $A_{436\ nm}$ at 436 nm, wherein $0 < A_{405\ nm}/T \leq 0.006$ and $0 < A_{436\ nm}/T \leq 0.005$, and the thickness T is 60 µm to 600 µm.

In some embodiments of the present application, when the photoresist film is characterized by ultraviolet-visible spectroscopy, the photoresist film further has an absorbance $A_{365\ nm}$ at 365 nm, wherein $0 < A_{365\ nm}/T \leq 0.010$.

In some embodiments of the present application, the ultraviolet-visible spectroscopy is measured by using an ultraviolet-visible spectrophotometer under the following operation conditions: the photoresist film is placed perpendicularly to a direction of incident light; a diffraction grating is configured as an optical splitter; testing temperature is 25° C.; testing pressure is 1 atm; an analysis mode is absorbance; a range of scanned wavelength is from 190 nm to 1100 nm; a blank sample is air; scan velocity is 2200 nm/min; a switch wavelength at which a light source is switched from a deuterium lamp to a tungsten lamp is 340.8 nm; a sampling interval is 0.2 nm; and a slit width is 2.0 nm.

In some embodiments of the present application, the photoresist film is a negative photoresist film.

In some embodiments of the present application, $0 < A_{405\ nm}/T \leq 0.002$ and $0 < A_{436\ nm}/T \leq 0.001$.

In some embodiments of the present application, the photoresist film comprises: (A) an alkali-soluble polymer; (B) a component of ethylenically unsaturated compound(s); and (C) a photopolymerization initiator.

In some embodiments of the present application, the component of ethylenically unsaturated compound(s) comprises bifunctional acrylic acid-based compound(s).

The amount of the bifunctional acrylic acid-based compound(s) can be 60 wt % or more based on the weight of the component of ethylenically unsaturated compound(s).

Another objective of the present application is to provide a composite film, comprising: the aforementioned photoresist film and a protective film on at least one surface of the photoresist film.

The protective film can be selected from the group consisting of a polyethylene terephthalate film, a polyolefin film, and composites thereof.

To render the above objectives, technical features, and advantages of the present application more apparent, the present application will be described in detail with reference to some specific embodiments hereinafter.

BRIEF DESCRIPTION OF THE DRAWINGS

Not applicable.

DESCRIPTION OF THE PREFERRED EMBODIMENTS

Some specific embodiments of the present application will be described in detail. However, the present application may be embodied in various embodiments and should not be limited to the embodiments described in the specification.

Unless additionally explained, the expressions "a," "the," or the like recited in the specification and the claims should include both the singular and the plural forms.

Unless additionally explained, the expressions "first," "second," or the like recited in the specification and the claims are only used to distinguish the illustrated elements or components without special meanings. Those expressions are not used to represent any priority.

Unless additionally explained, the term "(meth)acrylic acid", "(meth)acrylate", or the like recited in the specification and the claims intends to cover both embodiments where the functional group in the parentheses is included and not included. For example, the term "carboxyl-containing (meth)acrylic acid-based polymer" intends to cover carboxyl-containing acrylic acid-based polymer and carboxyl-containing methacrylic acid-based polymer; and the term "methyl (meth)acrylate" intends to cover methyl acrylate and methyl methacrylate.

In the specification and the claims, the weight average molecular weight (Mw) is measured by gel permeation chromatography (GPC) and is calculated by comparing it with a standard sample. The unit of the weight average molecular weight (Mw) is "g/mol".

The efficacy of the present application over prior art mainly lies in providing a photoresist film that has an excellent photoresist profile after exposure by controlling the values of $A_{405\ nm}/T$ and $A_{436\ nm}/T$ to be within specific ranges, thereby realizing high accuracy etching or electroplating processing. The photoresist film and applications thereof are described below in detail.

1. PHOTORESIST FILM

The photoresist film described herein refers to a film comprising a photosensitive resin composition.

A protective film that provides protection and support functions can be additionally provided on the surface of the photoresist film to facilitate the storage of the photoresist film and to protect the photoresist film from contamination or damage. Unless additionally explained, the "thickness" and "absorbance" recited in the specification and in the claims are described with respect to the photoresist film itself and does not include the rest parts, such as a protective film combined with the photoresist film. The photoresist film is further described below.

1.1. Properties of the Photoresist Film

The photoresist film of the present application has specific light absorbance properties. Specifically, when the photoresist film is characterized by ultraviolet-visible spectroscopy, the photoresist film has an absorbance $A_{405\ nm}$ at 405 nm, and an absorbance $A_{436\ nm}$ at 436 nm wherein the relationship between the absorbance $A_{405\ nm}$ and the thickness T (unit: μm) of the photoresist film follows $0 < A_{405\ nm}/T \leq 0.006$, and the relationship between the absorbance $A_{436\ nm}$ and the thickness T of the photoresist film follows $0 < A_{436\ nm}/T \leq 0.005$. For example, $A_{405\ nm}/T$ can be 0.0005, 0.001, 0.0015, 0.002, 0.0025, 0.003, 0.0035, 0.004, 0.0045, 0.005, 0.0055, or 0.006, or within a range between any two of the values described herein. $A_{436\ nm}/T$ can be 0.0005, 0.001, 0.0015, 0.002, 0.0025, 0.003, 0.0035, 0.004, 0.0045, or 0.005, or within a range between any two of the values described herein. If the $A_{405\ nm}/T$ or the $A_{436\ nm}/T$ is not within the aforementioned ranges, the photoresist pattern formed by the photoresist film after exposure and development has a poor photoresist profile and is not suitable for an etching or electroplating process that requires high accuracy. In a preferred embodiment of the present application, $0 < A_{405\ nm}/T \leq 0.002$ and $0 < A_{436\ nm}/T \leq 0.001$.

In some embodiments of the present application, when the photoresist film is characterized by ultraviolet-visible spectroscopy, the photoresist film further has an absorbance $A_{365\ nm}$ at 365 nm, wherein $0 < A_{365\ nm}/T \leq 0.010$, and the unit of T is m. For example, $A_{365\ nm}/T$ can be 0.0005, 0.001, 0.0015, 0.002, 0.0025, 0.003, 0.0035, 0.004, 0.0045, 0.005, 0.0055, 0.006, 0.0065, 0.007, 0.0075, 0.008, 0.0085, 0.009, 0.0095, or 0.010, or within a range between any two of the values described herein.

In the present application, the ultraviolet-visible spectroscopy is measured by using an ultraviolet-visible spectrophotometer under the following operation conditions: the photoresist film is placed perpendicularly to a direction of incident light; a diffraction grating is configured as an optical splitter; testing temperature is 25° C.; testing pressure is 1 atm; an analysis mode is absorbance; a range of scanned wavelength is from 190 nm to 1100 nm; a blank sample is air; scan velocity is 2200 nm/min; a switch wavelength at which a light source is switched from a deuterium lamp to a tungsten lamp is 340.8 nm; a sampling interval is 0.2 nm; and a slit width is 2.0 nm. In the aforementioned operation conditions, the photoresist film sample for analysis is obtained by cutting a composite film, which comprises a photoresist film and protective films on two sides of the photoresist film along the transverse direction (TD) and machine direction (MD) at an arbitrary position into a size of 5 cm×3 cm, and then removing the protective films from the cut photoresist film. The photoresist film must be placed perpendicularly to the direction of incident light so that the absorbance of the photoresist film can be correctly measured. The tungsten lamp used as an incident light source has a wavelength range greater than 340.8 nm. In addition, the "sampling interval" means that the data is collected and recorded every 0.2 nm within the scanned wavelength of 190 nm to 1100 nm.

The values of the absorbances $A_{405\ nm}$, $A_{436\ nm}$ and $A_{365\ nm}$ of the photoresist film of the present application can be adjusted by adjusting the components of the photoresist film or the drying conditions of the preparation process of the photoresist film. For example, the components of the photoresist film can be adjusted by selecting the species and amounts of additives. Examples of the additives include but are not limited to photopolymerization initiators, light absorbers, dyes, and the like. Persons having ordinary skill in the art would be able to achieve the desired absorbance through conventional experimentation based on the disclosure of the specification of the subject application.

The thickness T of the photoresist film of the present application is expressed in m.

The thickness T ranges from 60 μm to 600 μm, preferably from 100 μm to 600 μm. For example, the thickness T can be 60 μm, 70 μm, 80 μm, 90 μm, 100 μm, 110 μm, 120 μm, 130 μm, 140 μm, 150 μm, 160 μm, 170 μm, 180 μm, 190 μm, 200 μm, 210 μm, 220 μm, 230 μm, 240 μm, 250 μm, 260 μm, 270 μm, 280 μm, 290 μm, 300 μm, 310 μm, 320 μm, 330 μm, 340 μm, 350 μm, 360 μm, 370 μm, 380 μm, 390 μm, 400 μm, 410 μm, 420 μm, 430 μm, 440 μm, 450 μm, 460 μm, 470 μm, 480 μm, 490 μm, 500 μm, 510 μm, 520 μm, 530 μm, 540 μm, 550 μm, 560 μm, 570 μm, 580 μm, 590 μm, or 600 μm, or within a range between any two of the values described herein. The higher the thickness of the photoresist, the higher the possible thickness of the metal conductive layer. Therefore, the photoresist film of the present application is particularly suitable for 2.5D and 3D integrated circuits packaging and is useful in the patterning prior to the plating of the conductive layer.

The photoresist film of the present application can be a positive photoresist film or a negative photoresist film. In some embodiments of the present application, the photoresist film of the present application is a negative photoresist film. After exposure, the portion of the photoresist film that was not exposed to light will dissolve in the photoresist developer, and the portion of the photoresist film that was exposed to light will remain after development.

In an embodiment of the present application, the photoresist film of the present application is a dry film, i.e., a resin film with low solvent content. The aforementioned low solvent content means that the amount of solvent is 10 wt % or less, specifically 5 wt % or less, more specifically 0.1 to 4 wt % based on the total weight of the photoresist film. In contrast to ink-like and liquid-like wet films, dry films are less likely to flow or deform due to their low solvent content and can be attached to a substrate without the need for additional processes such as coating and drying. Therefore, dry films are easy to control and superior in operability.

1.2. Components of the Photoresist Film

With the premise that $0 < A_{405\ nm}/T \leq 0.006$ and $0 < A_{436\ nm}/T \leq 0.005$, the components of the photoresist film of the present application can be adjusted depending on the need.

In some embodiments of the present application, the photoresist film is a negative photoresist film. It comprises (A) an alkali-soluble polymer, (B) a component of ethylenically unsaturated compound(s), and (C) a photopolymerization initiator, and can optionally further comprise an additive.

1.2.1. (A) Alkali-Soluble Polymer

The alkali-soluble polymer is a carboxyl-containing polymer. Examples of the alkali-soluble polymer include but are not limited to a carboxyl-containing acrylic acid-based polymer, a carboxyl-containing vinyl aromatic-based polymer, a carboxyl-containing norbornene-based polymer, a carboxyl-containing epoxy-based polymer, a carboxyl-containing amide-based polymer, a carboxyl-containing amide epoxy-based polymer, a carboxyl-containing alkyd-based polymer, and a carboxyl-containing phenol-based polymer. The aforementioned alkali-soluble polymer can be used alone or in combination. In some embodiments of the present application, the alkali-soluble polymer is a carboxyl-containing acrylic acid-based polymer.

The alkali-soluble polymer can be obtained by polymerizing one or more carboxyl-containing polymerizable monomers, or by copolymerizing one or more carboxyl-containing polymerizable monomers with other polymerizable monomers that do not contain carboxyl. Therefore, the alkali-soluble polymer can comprise one or more repeating units derived from carboxyl-containing polymerizable monomers or comprises one or more repeating units derived from carboxyl-containing polymerizable monomers, and one or more repeating units derived from other polymerizable monomers.

In some embodiments of the present application, the alkali-soluble polymer has repeating units derived from at least one first polymerizable monomers and repeating units derived from at least one-second polymerizable monomers, wherein the first polymerizable monomers contain carboxyl. Examples of the first polymerizable monomers include but are not limited to (meth)acrylic acid, α-bromo(meth)acrylic acid, α-chloro(meth)acrylic acid, β-phthalimido(meth)acrylic acid, β-styryl(meth)acrylic acid, propiolic acid, fumaric acid, cinnamic acid, crotonic acid, itaconic acid, and maleic acid. The second polymerizable monomers do not contain carboxyl. Examples of the second polymerizable monomers include but are not limited to (meth)acrylate-based compounds such as methyl (meth)acrylate, ethyl (meth)acrylate, n-propyl (meth)acrylate, isopropyl (meth)acrylate, n-butyl (meth)acrylate, isobutyl (meth)acrylate, 2-ethylhexyl (meth)acrylate, tert-butyl (meth)acrylate, 2-hydroxyethyl (meth)acrylate, 2-hydroxypropyl (meth)acrylate, cyclohexyl (meth)acrylate, benzyl (meth)acrylate, 1-methyl-cyclopentyl (meth)acrylate, 1-methyl-cyclohexyl (meth)acrylate, 2-methyl-2-adamantyl (meth)acrylate, 2-ethyl-2-adamantyl (meth)acrylate, 2-butyl-2-adamantyl (meth)acrylate, tetrahydrofurfuryl methyl (meth)acrylate, dimethylamino ethyl (meth)acrylate, diethylamino ethyl (meth)acrylate, glycidyl methacrylate, 2,2,2-trifluoroethyl (meth)acrylate, and 2,2,3,3-tetrafluoropropyl (meth)acrylate; (meth)acrylonitrile; vinyl ester-based compounds such as vinyl acetate and vinyl n-butylate; vinyl aromatic-based compounds such as styrene, vinyl naphthalene, 3-acetoxystyrene, 4-acetoxystyrene, vinyl toluene, and α-methyl styrene; norbornene; acrylamide; maleate-based compounds such as monomethyl maleate, monoethyl maleate, and monoisopropyl maleate; and derivatives of the forgoing polymerizable monomers. The aforementioned first polymerizable monomers and second polymerizable monomers can be used alone or in combination.

In a preferred embodiment of the present application, the alkali-soluble polymer is obtained by copolymerizing (meth)acrylic acid and one or more (meth)acrylate-based compounds. Therefore, the alkali-soluble polymer comprises repeating units derived from (meth)acrylic acid and repeating units derived from a (meth)acrylate-based compound. The weight ratio of the (meth)acrylic acid to the (meth)acrylate-based compound can be 1:20 to 1:1, more specifically 1:6 to 1:4. For example, the weight ratio of the (meth)acrylic acid to the (meth)acrylate-based compound can be 1:20, 1:19, 1:18, 1:17, 1:16, 1:15, 1:14, 1:13, 1:12, 1:11, 1:10, 1:9, 1:8, 1:7, 1:6, 1:5, 1:4, 1:3, 1:2, or 1:1, or within a range between any two of the values described herein.

The average molecular weight of the alkali-soluble polymer can be 10,000 to 180,000, preferably 40,000 to 80,000. For example, the weight average molecular weight of the alkali-soluble polymer can be 10,000, 15,000, 20,000, 25,000, 30,000, 35,000, 40,000, 45,000, 50,000, 55,000, 60,000, 65,000, 70,000, 75,000, 80,000, 85,000, 90,000, 95,000, 100,000, 105,000, 110,000, 115,000, 120,000, 125,000, 130,000, 135,000, 140,000, 145,000, 150,000, 155,000, 160,000, 165,000, 170,000, 175,000, or 180,000, or within a range between any two of the values described herein.

The amount of the alkali-soluble polymer based on the total weight of the photoresist film can be 20 wt % to 85 wt %, specifically 40 wt % to 80 wt %, and more specifically, 50 wt % to 75 wt %. For example, the amount of the alkali-soluble polymer based on the total weight of the photoresist film can be 20 wt %, 22.5 wt %, 25 wt %, 27.5 wt %, 30 wt %, 32.5 wt %, 35 wt %, 37.5 wt %, 40 wt %, 42.5 wt %, 45 wt %, 47.5 wt %, 50 wt %, 52.5 wt %, 55 wt %, 57.5 wt %, 60 wt %, 62.5 wt %, 65 wt %, 67.5 wt %, 70 wt %, 72.5 wt %, 75 wt %, 77.5 wt %, 80 wt %, 82.5 wt %, or 85 wt %, or within a range between any two of the values described herein.

1.2.2. (B) Component of Ethylenically Unsaturated Compound(s)

The ethylenically unsaturated compound(s) refers to compound(s) with at least one reactive ethylene functional group and is preferably a bifunctional compound(s) with two reactive ethylene functional groups. In some embodiments of the present application, the component of ethylenically unsaturated compounds comprises a monofunctional or multifunctional acrylic acid-based compound and preferably comprises bifunctional acrylic acid-based compound(s). Examples of acrylic acid-based compound include but are not limited to ethoxylated trimethylolpropane triacrylate, ethoxylated bisphenol-A diacrylate, ethoxylated bisphenol-A dimethacrylate, tripropylene glycol diacrylate, 1,6-hexanediol diacrylate, polypropylene glycol diacrylate, tris((meth)acryloxyisocyanate) hexamethylene isocyanurate, ethoxylated urethane di(meth)acrylate, propoxylated urethane di(meth)acrylate, ethoxylated/propoxylated urethane di(meth)acrylate, ethoxylated tris(methacryloxyisocyanate) hexamethylene isocyanurate, acrylated tris(methacryloxyisocyanate) hexamethylene isocyanurate, ethoxylated/propoxylated tris(methacryloxyisocyanate) hexamethylene isocyanurate. Furthermore, based on the weight of the component of ethylenically unsaturated compounds, the amount of the bifunctional acrylic acid-based compound is preferably 60 wt % or more. For example, based on the weight of the component of ethylenically unsaturated compounds, the amount of the bifunctional acrylic acid-based compound can be 60 wt %, 62.5 wt %, 65 wt %, 67.5 wt %, 70 wt %, 72.5 wt %, 75 wt %, 77.5 wt %, 80 wt %, 82.5 wt %, 85 wt %, 87.5 wt %, 90 wt %, 92.5 wt %, 95 wt %, 97.5 wt %, or 100 wt %, or within a range between any two of the values described herein.

In some embodiments of the present application, the component of ethylenically unsaturated compounds comprises ethoxylated trimethylolpropane triacrylate and ethoxylated bisphenol-A dimethacrylate.

The amount of the component of ethylenically unsaturated compounds based on the total weight of the photoresist film can be 5 wt % to 70 wt %, specifically 15 wt % to 50 wt %, and more specifically 20 wt % to 45 wt %. For example, the amount of the component of ethylenically unsaturated compounds based on the total weight of the photoresist film can be 5 wt %, 7.5 wt %, 10 wt %, 12.5 wt %, 15 wt %, 17.5 wt %, 20 wt %, 22.5 wt %, 25 wt %, 27.5 wt %, 30 wt %, 32.5 wt %, 35 wt %, 37.5 wt %, 40 wt %, 42.5 wt %, 45 wt %, 47.5 wt %, 50 wt %, 52.5 wt %, 55 wt %, 57.5 wt %, 60 wt %, 62.5 wt %, 65 wt %, 67.5 wt %, or 70 wt %, or within a range between any two of the values described herein.

1.2.3. (C) Photopolymerization Initiator

The photopolymerization initiator refers to a substance that can initiate polymerization reaction in the presence of light. The species of the photopolymerization initiator are not particularly limited. Examples of the photopolymerization initiator include but are not limited to imidazole-based compounds, ketone-based compounds, quinone-based compounds, benzoin-based or benzoin ether-based compounds, polyhalogenated compounds, triazine-based compounds, organic peroxide compounds, onium compounds, and other common photopolymerization initiators known in the art. The aforementioned photopolymerization initiators can be used alone or in combination.

Examples of the imidazole-based compounds include but are not limited to 2,4,6-triaryl imidazole dimer, such as 2-(o-chlorophenyl)-4,5-diphenylimidazole dimer, 2-(o-chlorophenyl)-4,5-di(m-methoxyphenyl) imidazole dimer, 2-(o-fluorophenyl)-4,5-diphenylimidazole dimer, 2-(o-methoxyphenyl)-4,5-diphenyl-4,5-triarylimidazole dimer, and 2-(p-methoxyphenyl)-4,5-diphenylimidazole dimer.

Examples of the ketone-based compounds include but are not limited to benzophenone, 4,4-bis(dimethylamino) benzophenone, 4-methoxy-4'-dimethylamino benzophenone, 4,4'-dimethoxy benzophenone, 4-dimethylamino benzophenone, 4-dimethylamino acetophenone, xanthone, thioxanthone, 2-chloro thioxanthone, 2,4-diethyl thioxanthone, acridone, α-hydroxy acetophenone, α-amino acetophenone, α-hydroxycycloalkyl phenone, and dialkyl acetophenone.

Examples of quinone-based compounds include but are not limited to camphorquinone, benzanthraquinone, 2-tert-butylanthraquinone, and 2-methylanthraquinone.

Examples of benzoin-based or benzoin ether-based compounds include but are not limited to benzoin methyl ether, benzoin ethyl ether, benzoin propyl ether, and benzoin phenyl ether.

Examples of polyhalogenated compounds include but are not limited to carbon tetrabromide, phenyl tribromomethyl sulfone, and phenyl trichloromethyl ketone.

Examples of triazine-based compounds include but are not limited to 2,4,6-tris(trichloromethyl)-s-triazine, 2-methoxy-4,6-bis(trichloromethyl)-s-triazine, 2-amino-4,6-bis(trichloromethyl)-s-triazine, and 2-(p-methoxyphenyl ethenyl)-4,6-bis(trichloromethyl)-s-triazine.

Examples of organic peroxide compounds include but are not limited to methyl ethyl ketone peroxide, cyclohexanone peroxide, 3,3,5-trimethyl cyclohexanone peroxide, benzoyl peroxide, di-tert-butyl isophthalate peroxide, 2,5-dimethyl-2,5-di(benzoylperoxy)hexane, tert-butyl peroxybenzoate, a,a'-bis(tert-butylperoxyisopropyl)benzene, dicumyl peroxide, and 3,3',4,4'-tetra(tert-butylperoxycarbonyl)benzophenone.

Examples of the onium compounds include but are not limited to diaryliodonium salts and triarylsulfonium salts obtained from diphenyliodonium, 4,4'-dichlorodiphenyliodonium, 4,4'-dimethoxydiphenyliodonium, 4,4'-di-tert-butyldiphenyliodonium, 4-methyl-4'-isopropyldiphenyliodonium, or 3,3'-nitrodiphenyl iodonium in combination with chloride, bromide, tetrafluoroborate, hexafluorophosphate, hexafluoroarsenate, hexafluoroantimonate, tetrakis(pentafluorophenyl)borate, or trifluoromethanesulfonic acid.

Examples of the aforementioned other common photopolymerization initiators known in the art include but are not limited to fluorine, bisacylphosphine oxides, azinium compounds, organic boron compounds, phenylglyoxylate, and titanocene.

In some embodiments of the present application, the photopolymerization initiator is an imidazole-based compound or a ketone-based compound.

In the photoresist film of the present application, the amount of the photopolymerization initiator based on the total weight of the photoresist film can be 0.1 wt % to 15 wt %, specifically, 0.5 wt % to 10 wt %, and more specifically 1 wt % to 5 wt %. For example, the amount of the photopolymerization initiator based on the total weight of the photoresist film can be 0.1 wt %, 0.5 wt %, 1 wt %, 1.5 wt %, 2 wt %, 2.5 wt %, 3 wt %, 3.5 wt %, 4 wt %, 4.5 wt %, 5 wt %, 5.5 wt %, 6 wt %, 6.5 wt %, 7 wt %, 7.5 wt % 8 wt %, 8.5 wt %, 9 wt %, 9.5 wt % 10 wt %, 10.5 wt %, 11 wt %, 11.5 wt %, 12 wt %, 12.5 wt %, 13 wt %, 13.5 wt %, 14 wt %, 14.5 wt %, or 15 wt %, or within a range between any two of the values described herein.

1.2.4. Optional Additives

With the premise that $0<A_{405\ nm}/T\leq0.006$ and $0<A_{436\ nm}/T\leq0.005$, the photoresist film of the present application can further comprise additives to improve the properties of the photoresist film. Examples of the aforementioned additives include but are not limited to light absorbers, dyes, pigments, radical inhibitors, and surfactants. The aforementioned additives can be used alone or in combination. In some embodiments of the present application, the photoresist film further comprises a light absorber to adjust the absorbance of the photoresist film at a specific wavelength.

1.3. Preparation of the Photoresist Film

The preparation method of the photoresist film of the present application is not particularly limited. Persons having ordinary skill in the art would be able to prepare the photoresist film of the present application based on the disclosure of the specification of the subject application. For example, in the case of preparing the aforementioned negative photoresist film, the photoresist film can be prepared by the following process: evenly mixing the components of the photoresist film, including (A) an alkali-soluble polymer, (B) a component of ethylenically unsaturated compound(s), (C) a photopolymerization initiator, and optional additives, with a stirrer and dissolve or disperse them in a solvent to provide a resin composition; coating the resin composition onto a substrate; and then drying the coated resin composition to obtain a photoresist film. A detailed preparation method is illustrated in the Examples below.

2. APPLICATIONS OF THE PHOTORESIST FILM

In general, each of the surfaces of the photoresist film will be covered with a protective film that provides protection and support prior to use to facilitate the storage of the photoresist film and avoid damage and contamination of foreign material. Therefore, the present application also provides a composite film, comprising the aforementioned photoresist film and a protective film on at least one surface of the photoresist film. In the preferred embodiment of the present application, a protective film is provided on each of the surfaces of the photoresist film, and the materials of the protective films on different surfaces of the photoresist film can be identical or different.

The type of protective film is not particularly limited and can be any conventional film known in the art. For example, the protective film can be selected from the group consisting of a polyethylene terephthalate film (PET film), a polyolefin film and composites thereof. Examples of polyolefin film include but are not limited to a polyethylene film (PE film) and a polypropylene film (PP film), such as an oriented polypropylene film. The composite can be a composite of a polyethylene terephthalate film and a polyolefin film or a composite of different polyolefin films. In the preferred embodiment of the present application, the composite film comprises a PET film on one surface of the photoresist film and a PE film on the other surface of the photoresist film.

The preparation method of the composite film of the present application is not particularly limited and can be any method known in the art. Persons having ordinary skill in the art would be able to prepare the composite film based on the disclosure of the specification of the subject application. For example, the composite film can be prepared by stacking the protective films on both surfaces of the photoresist film to provide a laminate and pressing the laminate to obtain the composite film. Alternatively, the composite film can be prepared by coating a resin composition for forming a photoresist film onto a first protective film, drying the coated resin composition to form a photoresist film on the first protective film, and then adhering a second protective film on the surface of the photoresist film which is not in contact with the first protective film. Alternatively, the composite film can be prepared by extruding a resin composition for forming a photoresist film to the gap between two protective films spaced at a determined distance and then drying the extruded resin composition to form a photoresist film between the two protective films.

3. EXAMPLES 3.1. Testing Methods
[Thickness of the Photoresist Film]

The prepared composite film comprising a photoresist film was cut into a size of 5 cm×3 cm, and then the protective films on both surfaces of the photoresist film were removed. The obtained photoresist film was placed on a platform (MS-11C platform) of a film thickness gauge (model number: Nikon Digimicro MFC-101+MS-11C, available from Nikon Company), and was measured by using an MFC-101 counter with a testing pressure of 140 gf. The thickness of the photoresist film was determined by measuring 10 different points and averaging the measured values.

[Absorbance of the Photoresist Film]

The prepared composite film comprising a photoresist film was cut into a size of 5 cm×3 cm, and then the protective films on both surfaces of the photoresist film were removed. The obtained photoresist film was measured using an ultraviolet-visible spectrophotometer (model number: Shimadzu UV-1601, available from Shimadzu Company) in the following manners.

The photoresist film was placed perpendicularly to a direction of incident light by using a jig, and the measurement was conducted under the following operation conditions: a diffraction grating was configured as an optical splitter; testing temperature was 25° C.; testing pressure was 1 atm; an analysis mode was absorbance; a range of scanned wavelength was from 190 nm to 1100 nm; a blank sample was air; scan velocity was 2200 nm/min; a switch wavelength at which a light source was switched from a deuterium lamp to a tungsten lamp was 340.8 nm; a sampling interval was 0.2 nm; a slit width was 2.0 nm; and a Shimadzu UV Probe V1.11 software was used for analysis. The absorbance $A_{405\ nm}$ at 405 nm, the absorbance $A_{436\ nm}$ at 436 nm, and the absorbance $A_{365\ nm}$ at 365 nm were obtained.

[Cross-Sectional Shape of the Photoresist Pattern]

A Ti(600A)/Cu(2000A) wafer with a diameter of 6 inches and a thickness of 625 μm was pre-heated in a batch oven at 80° C. for 10 minutes, and the temperature at the surface of the wafer was kept at 50° C. before pressing a film. The photoresist film was placed onto the surface of the wafer and was pressed with a film laminator (model number: CSL-M25E, available from C SUN Company), wherein the pressing temperature was 105° C., the pressing pressure was 3 kg/cm², and the pressing velocity was 2.0 m/min. After the pressing was completed, the redundant parts of the film were removed, and the obtained photoresist film sample was left for 15 minutes to cool down to room temperature.

The minimum developing time was measured by the following process: preparing a 0.9% to 1.1% $Na_2CO_3$ aqueous solution, setting the temperature of the solution for 29° C. to 31° C. and the spraying pressure for 2.0 kg/cm²; placing the photoresist film sample along with the wafer into a developing machine (model number: S30C, available from Pioneer Technology Engineering Company) and activating "flush" and "swing", wherein the length of the developing section is 1.3 μm, and the length of the washing section is 1.3 m; and recording the time point at which the photoresist is fully developed and removed as the minimum developing time (MDT).

The photoresist film was exposed using a stepper (model number: Ultratech Stepper Spectrum, available from Ultratech Company). The wavelengths of the exposure light sources were 405 nm, 436 nm, and 365 nm, respectively. The exposure process was continued until the exposure energy reached 800 mJ/cm². The target photoresist pattern had a depth-to-width ratio of 2.0, and the dimension of the patterned portion to the non-patterned portion (i.e., diameter of via: width of photoresist) was 1:1. After the exposure was completed, the exposed photoresist film was left for 30 minutes. Afterwards, the exposed photoresist film was developed by using a 0.9% to 1.1% $Na_2CO_3$ aqueous solution, setting the temperature of the solution for 29° C. to 31° C., setting the spraying pressure for 2.0 kg/cm², and setting the developing time to be two times the minimum developing time (MDT*2), thereby obtaining a developed photoresist film.

The developed photoresist film, along with the wafer, was broken by a wafer cutter at the non-patterned portion (at the via), and the cross-sectional shape of the photoresist pattern was observed using a scanning electron microscope, wherein the specimen was tilted by 75°, and the magnification was 200×. A cross-section of the photoresist was randomly chosen, and the widths of the photoresist at the positions of 1/25, 2/25, 3/25, 4/25, and 5/25 of the total thickness of the photoresist calculated from the upper edge of the photoresist (the edge away from the wafer) were measured, and the measured five values were averaged to obtain the upper width. In addition, the widths of the photoresist at the positions of 1/25, 2/25, 3/25, 4/25, and 5/25 of the total thickness of the photoresist calculated from the bottom edge of the photoresist (the edge contacting the wafer) were measured, and the measured five values were averaged to obtain the lower width. If the value of "|(upper width−lower width)|/thickness" is lower than 0.04, the result is recorded as "rectangle", meaning that the cross-sectional shape of the photoresist pattern is good. If the value of "|(upper width−lower width)|/thickness" is 0.04 or higher, the result is recorded as "trapezoid", meaning that the cross-sectional shape of the photoresist pattern is poor. The "|(upper width−lower width)|" in the equation represents an absolute value of "(upper width−lower width)".

[Footing Length of the Photoresist Pattern]

A Ti(600A)/Cu(2000A) wafer with a diameter of 6 inches and a thickness of 625 μm was pre-heated in a batch oven at 80° C. for 10 minutes, and the temperature at the surface of the wafer was kept at 50° C. before pressing a film. The photoresist film was placed onto the surface of the wafer and was pressed with a film laminator (model number: CSL-M25E, available from C SUN Company), wherein the pressing temperature was 105° C., the pressing pressure was 3 kg/cm², and the pressing velocity was 2.0 m/min. After the pressing was completed, the redundant parts of the film were removed, and the obtained photoresist film sample was left for 15 minutes to cool down to room temperature.

The photoresist film was exposed using a stepper (model number: Ultratech Stepper Spectrum, available from Ultratech Company). The wavelengths of the exposure light sources were 405 nm, 436 nm, and 365 nm, respectively. The exposure process was continued until the exposure energy reached 800 mJ/cm². The target photoresist pattern had a depth-to-width ratio of 2.0, and the dimension of the patterned portion to the non-patterned portion (i.e., diameter of via: width of photoresist) was 1:1. After the exposure was completed, the exposed photoresist film was left for 30 minutes to 24 hours. Afterwards the exposed photoresist film was developed by using a 0.9% to 1.1% $Na_2CO_3$ aqueous solution, setting the temperature of the solution for 29° C. to 31° C., setting the spraying pressure for 2.0 kg/cm², and setting the developing time respectively to be two times the minimum developing time (MDT*2) and four times the minimum developing time (MDT*4), thereby obtaining a developed photoresist film. The minimum developing time (MDT) was based on the testing result of the minimum developing time described in the section [Cross-sectional shape of the photoresist pattern].

The developed photoresist film, along with the wafer, was broken by a wafer cutter at the non-patterned portion (at the via), and the cross-sectional shape of the photoresist pattern was observed using a scanning electron microscope, wherein the specimen was tilted by 75°, and the magnification was 5000×. A cross-section of the photoresist was randomly chosen, and the side where the bottom of the photoresist protruded more toward the non-photoresist pattern portion was chosen to measure footing length. The footing length was calculated as follows: taking the position at the sidewall of the photoresist that is ⅕ of the total thickness of the photoresist away from the bottom edge of the photoresist as a reference point; and drawing a reference line extending downward from the reference point and perpendicular to the surface of the wafer.

The distance between "the intersection point of the reference line and the surface of the wafer" and "the intersection point of the sidewall of the photoresist and the surface of the wafer", i.e., the footing length, was calculated.

3.2. Preparation and Testing of the Photoresist Film 3.2.1. Synthesis of the Alkali-Soluble Polymer According to Synthesis Examples 1-3 below, carboxyl-containing acrylic acid-based polymers as the alkali-soluble polymers were prepared.

Synthesis Example 1

As the co-polymerization monomers, 15 g of methacrylic acid, 50 g of methyl methacrylate, 30 g of butyl acrylate, and 5 g of butyl methacrylate were mixed with 1.0 g of azobisisoheptylnitrile to prepare a solution a1. Separately, 0.5 g of azobisisoheptylnitrile was dissolved in 20 g of ethyl acetate solvent to prepare a solution b1.

A flask equipped with a stirrer, a reflux cooler, a thermometer, and a pipette was prepared, and 80 g of ethyl acetate (solvent) was added into the flask and heated to 70° C. Then, solution a1 was added dropwise into the flask with a constant rate within 3 hours, and the solution in the flask was maintained at a temperature of 70° C. and stirred for 2 hours. Then, the solution b1 was added dropwise into the flask with a constant rate within 0.5 hours, and the solution in the flask was maintained at a temperature of 70° C. and stirred for 5 hours. Afterwards, the solution in the flask was heated to 90° C. and stirred for 5 hours to sufficiently perform the reaction. After the reaction was completed, the resultant was cooled to room temperature to obtain a carboxyl-containing acrylic acid-based polymer A (also referred to as "polymer A" hereinafter), which has a weight average molecular weight of 65,000 and a solid content of 50 wt %.

Synthesis Example 2

As the co-polymerization monomers, 15 g of methacrylic acid, 65 g of methyl methacrylate, 10 g of butyl acrylate, and 10 g of butyl methacrylate were mixed with 0.75 g of azobisisoheptylnitrile to prepare a solution a2. Separately, 0.5 g of azobisisoheptylnitrile was dissolved in 20 g of ethyl acetate solvent to prepare a solution b2.

A flask equipped with a stirrer, a reflux cooler, a thermometer, and a pipette was prepared, and 102.2 g of ethyl acetate was added into the flask and heated to 70° C. Then, the solution a2 was added dropwise into the flask with a constant rate within 3 hours, and the solution in the flask was maintained at a temperature of 70° C. and stirred for 2 hours. Then, the solution b2 was added dropwise into the flask with a constant rate within 0.5 hours, and the solution in the flask was maintained at a temperature of 70° C. and stirred for 5 hours. Afterwards, the solution in the flask was heated to 90° C. and stirred for 5 hours to sufficiently perform the reaction. After the reaction was completed, the resultant was cooled to room temperature to obtain a carboxyl-containing acrylic acid-based polymer B (also referred to as "polymer B" hereinafter), which has a weight average molecular weight of 65,000 and a solid content of 45 wt %.

Synthesis Example 3

As the co-polymerization monomers, 20 g of methacrylic acid, 45 g of methyl methacrylate, and 35 g of 2-ethylhexyl acrylate were mixed with 0.5 g of azobisisoheptylnitrile to prepare a solution a3. Separately, 0.5 g of azobisisoheptylnitrile was dissolved in 20 g of ethyl acetate solvent to prepare a solution b3.

A flask equipped with a stirrer, a reflux cooler, a thermometer, and a pipette was prepared, and 80 g of ethyl acetate was added into the flask and heated to 70° C. Then, the solution a3 was added dropwise into the flask with a constant rate within 3 hours, and the solution in the flask was maintained at a temperature of 70° C. and stirred for 2 hours. Then, the solution b3 was added dropwise into the flask with a constant rate within 0.5 hours, and the solution in the flask was maintained at a temperature of 70° C. and stirred for 5 hours. Afterwards, the solution in the flask was heated to 90° C. and stirred for 5 hours to sufficiently perform the reaction.

After the reaction was completed, the resultant was cooled to room temperature to obtain a carboxyl-containing acrylic acid-based polymer C (also referred to as "polymer C" hereinafter), which has a weight average molecular weight of 55,000 and a solid content of 50 wt %.

3.2.2. Preparation of the Photoresist Film

The information about raw materials used in the following examples and comparative examples are shown in Table 1 below.

TABLE 1

| Raw materials | Description |
|---|---|
| Polymer A | Alkali-soluble polymer, the carboxyl-containing acrylic acid-based polymer A prepared in Synthesis Example 1 |
| Polymer B | Alkali-soluble polymer, the carboxyl-containing acrylic acid-based polymer B prepared in Synthesis Example 2 |
| Polymer C | Alkali-soluble polymer, the carboxyl-containing acrylic acid-based polymer C prepared in Synthesis Example 3 |
| 3EO TMPTA | Component of ethylenically unsaturated compound, ethoxylated trimethylolpropane triacrylate, CAS number: 28961-43-5 |
| Bis-A 10EO DMA | Component of ethylenically unsaturated compound, ethoxylated bisphenol-A dimethacrylate, CAS number: 41637-38-1 |
| HABI; BCIM | Photopolymerization initiator, imidazole-based compound, CAS number: 7189-82-4 |
| TCDM | Photopolymerization initiator, imidazole-based compound, CAS number: 100486-97-3 |
| EABF | Photopolymerization initiator, ketone-based compound, CAS number: 90-93-7 |
| IR907 | Photopolymerization initiator, ketone-based compound, CAS number: 71868-10-5 |
| BDK | Photopolymerization initiator, ketone-based compound, CAS number: 24650-42-8 |
| Oil Yellow | Light absorber, dye, CAS number: 3321-10-4 |
| ADMA | Light absorber, dye, CAS number: 603-48-5 |
| 9PA | Light absorber, CAS number: 602-56-2 |
| NPG | Light absorber, CAS number: 103-01-5 |
| 2-mercaptobenzimidazole | Light absorber, CAS number: 583-39-1 |
| C.I.42040 | Light absorber, dye, CAS number: 633-03-4 |
| THF | Solvent, tetrahydrofuran, CAS number: 109-99-9 |

The components were mixed according to the proportion shown in Table 2 below and stirred for 1 hour to be evenly mixed, thereby obtaining a resin composition. The obtained resin composition was coated onto a PET film serving as a protective film with a Kodaira wire-wound rod. Then the coated resin composition was dried in an oven at 100° C. for 24 minutes. Afterwards, the surface of the dried resin composition was covered with a PE film serving as a protective film, thereby obtaining the photoresist film covered by protective films (i.e., a composite film) of each of Examples 1 to 7 (E1 to E7) and Comparative Examples 1 to 5 (CE1 to CE5).

TABLE 2

| Unit: parts by weight | E1 | E2 | E3 | E4 | E5 | E6 | E7 | CE1 | CE2 | CE3 | CE4 | CE5 |
|---|---|---|---|---|---|---|---|---|---|---|---|---|
| Polymer A | 200 | | 200 | 200 | | 200 | | 200 | | 200 | | |
| Polymer B | | 222 | | | | | 222 | | | | 222 | 222 |
| Polymer C | | | | | 200 | | | | 200 | | | |
| 3EO TMPTA | 5 | 5 | 5 | 5 | 10 | 10 | 5 | 5 | 5 | 5 | 10 | 30 |
| Bis-A 10EO DMA | 45 | 30 | 30 | 30 | 30 | 30 | 30 | 30 | 30 | 30 | 46 | 5 |
| HABI; BCIM | 3.2 | 3.2 | 2.5 | 3.2 | 3.5 | 1.5 | 2 | 5 | 5.5 | 5.5 | 4 | 1 |
| TCDM | | | | | | 0.2 | | | | | 0.2 | |
| EABF | 0.03 | | 0.01 | 0.03 | 0.02 | 0.03 | 0.01 | 0.5 | 0.3 | 0.2 | 0.4 | |
| IR907 | | 0.02 | | | | | | | | | 0.2 | 0.02 |
| BDK | | | | | | | | 4 | 3 | 2.5 | | |
| Oil Yellow | | | | | | | | | | | | 0.5 |
| ADMA | 0.1 | 0.1 | 0.08 | 0.1 | 0.08 | 0.1 | 0.05 | 1 | 1 | 1 | 0.8 | 0.8 |
| 9PA | | 0.15 | | 0.1 | | | | 1 | 0.7 | 0.5 | | |
| NPG | 0.02 | 0.0 | 0.01 | 0.02 | 0.01 | 0.02 | 0.01 | 0.02 | | | | 0.1 |
| 2-mercaptobenzimidazole | 0.01 | 0.01 | 0.01 | 0.02 | 0.01 | 0.01 | 0.01 | | | | 0.01 | |

TABLE 2-continued

| Unit: parts by weight | E1 | E2 | E3 | E4 | E5 | E6 | E7 | CE1 | CE2 | CE3 | CE4 | CE5 |
|---|---|---|---|---|---|---|---|---|---|---|---|---|
| C.I.42040 | 0.01 | 0.01 | 0.01 | 0.01 | 0.01 | 0.01 | 0.01 | 0.01 | 0.01 | 0.01 | 0.01 | 0.01 |
| THF | 10 | 10 | 10 | 10 | 10 | 10 | 10 | 10 | 10 | 10 | 10 | 10 |

3.2.3. Testing of the Photoresist Film

The photoresist films of Examples 1 to 7 and Comparative Examples 1 to 5 were tested according to the testing methods described above, and the results are tabulated in Table 3 below.

TABLE 3

| | E1 | E2 | E3 | E4 | E5 | E6 | E7 | CE1 | CE2 | CE3 | CE4 | CE5 |
|---|---|---|---|---|---|---|---|---|---|---|---|---|
| $A_{405\,nm}/T$ | 0.005 | 0.005 | 0.002 | 0.006 | 0.004 | 0.003 | 0.001 | 0.009 | 0.007 | 0.008 | 0.012 | 0.014 |
| $A_{436\,nm}/T$ | 0.004 | 0.005 | 0.001 | 0.004 | 0.003 | 0.002 | 0.001 | 0.008 | 0.006 | 0.006 | 0.012 | 0.013 |
| $A_{365\,nm}/T$ | 0.009 | 0.006 | 0.005 | 0.010 | 0.008 | 0.008 | 0.004 | 0.023 | 0.008 | 0.007 | 0.038 | 0.005 |
| Thickness T of photoresist film (μm) | 250 | 250 | 250 | 250 | 60 | 600 | 500 | 250 | 250 | 250 | 250 | 250 |
| \|(upper width − lower width)\| (μm) | <5 | <5 | <5 | <5 | <2 | <5 | <5 | >20 | >20 | >20 | >20 | >20 |
| The shape of photoresist pattern | rec-tangle | rec-tangle | rec-tangle | rec-tangle | rec-tangle | rec-tangle | rec-tangle | trap-ezoid | trap-ezoid | trap-ezoid | trap-ezoid | trap-ezoid |
| Footing length (MDT * 2; μm) | 5 | 7 | 3 | 5 | 3 | 4 | 3 | 25 | 15 | 18 | 30 | 35 |
| Footing length (MDT * 4; μm) | 7 | 9 | 3 | 7 | 5 | 5 | 3 | >35 | >35 | >35 | >35 | >35 |
| Summary | Good | Good | Good | Good | Good | Good | Good | Poor | Poor | Poor | Poor | Poor |

As shown in Table 3, the photoresist films of Examples 1 to 7 (E1 to E7) of the present application have the features of $0<A_{405\,nm}/T\leq0.006$ and $0<A_{436\,nm}/T\leq0.005$. The photoresist patterns formed after the exposure and development of the photoresist films each have a rectangle shape and short footing length (shorter than 10 m), meaning that the photoresist patterns each have an excellent photoresist profile. In particular, Examples 3 and 7 (E3 and E7) further show that when the photoresist films have the features of $0<A_{405\,nm}/T\leq0.002$ and $0<A_{436\,nm}/T\leq0.001$, the photoresist pattern has the shortest footing length and is therefore the best photoresist profile. By contrast, the photoresist films of Comparative Examples 1 to 5 (CE1 to CE5) do not have the features of $0<A_{405\,nm}/T\leq0.006$ and $0<A_{436\,nm}/T\leq0.005$, and the photoresist patterns formed after the exposure and development of the comparative photoresist films do not have a rectangle shape and have longer footing length, meaning that the photoresist patterns have poor photoresist profiles. Such photoresist films are not useful in an etching or electroplating process that requires high accuracy.

The above examples illustrate the principle and efficacy of the present application and show the inventive features thereof. People skilled in this field may proceed with various modifications and replacements based on the disclosures and suggestions of the invention as described. Therefore, the scope of protection of the present application is as defined in the claims as appended.

What is claimed is:

1. A photoresist film, which has a thickness T with a unit of μm, and when the photoresist film is characterized by ultraviolet-visible spectroscopy, the photoresist film has an absorbance $A_{405\,nm}$ at 405 nm, an absorbance $A_{436\,nm}$ at 436 nm and an absorbance $A_{365\,nm}$ at 365 nm, wherein $0<A_{405nm}/T\leq0.006$, $0<A_{436nm}/T\leq0.004$ and $0<A_{365\,nm}/T\leq0.010$, and the thickness T is 60 μm to 600 μm, wherein the ultraviolet-visible spectroscopy is measured by using an ultraviolet-visible spectrophotometer under the following operation conditions: the photoresist film is placed perpendicularly to a direction of incident light; a diffraction grating is configured as an optical splitter; testing temperature is 25° C.; testing pressure is 1 atm; an analysis mode is absorbance; a range of scanned wavelength is from 190 nm to 1100 nm; a blank sample is air; scan velocity is 2200 nm/min; a switch wavelength at which a light source is switched from a deuterium lamp to a tungsten lamp is 340.8 nm; a sampling interval is 0.2 nm; and a slit width is 2.0 nm.

2. The photoresist film of claim 1, which is a negative photoresist film.

3. The photoresist film of claim 1, wherein $0<A_{405\,nm}/T\leq0.002$ and $0<A_{436\,nm}/T\leq0.001$.

4. The photoresist film of claim 1, which comprises:
   (A) an alkali-soluble polymer;
   (B) a component of ethylenically unsaturated compound(s); and
   (C) a photopolymerization initiator.

5. The photoresist film of claim 4, wherein the component of ethylenically unsaturated compound(s) comprises bifunctional acrylic acid-based compound(s).

6. The photoresist film of claim 5, wherein based on the weight of the component of ethylenically unsaturated compound(s), the amount of the bifunctional acrylic acid-based compound(s) is 60 wt % or more.

7. A composite film, which comprises:
   the photoresist film of claim 1; and
   a protective film on at least one surface of the photoresist film.

8. The composite film of claim 7, wherein the protective film is selected from the group consisting of a polyethylene terephthalate film, a polyolefin film, and composites thereof.

* * * * *